United States Patent
Aoyagi et al.

(10) Patent No.: US 11,824,038 B2
(45) Date of Patent: Nov. 21, 2023

(54) WIRE BONDING APPARATUS

(71) Applicant: SHINKAWA LTD., Tokyo (JP)

(72) Inventors: Nobuyuki Aoyagi, Tokyo (JP); Shigeru Amemiya, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 441 days.

(21) Appl. No.: 17/259,192

(22) PCT Filed: Jul. 11, 2019

(86) PCT No.: PCT/JP2019/027437
§ 371 (c)(1),
(2) Date: Jan. 10, 2021

(87) PCT Pub. No.: WO2020/013257
PCT Pub. Date: Jan. 16, 2020

(65) Prior Publication Data
US 2021/0272927 A1 Sep. 2, 2021

(30) Foreign Application Priority Data

Jul. 11, 2018 (JP) .................................. 2018-131165

(51) Int. Cl.
*H01L 23/00* (2006.01)
*B06B 1/02* (2006.01)
(Continued)

(52) U.S. Cl.
CPC ............ *H01L 24/78* (2013.01); *B06B 1/0276* (2013.01); *B06B 1/0622* (2013.01);
(Continued)

(58) Field of Classification Search
None
See application file for complete search history.

(56) References Cited

U.S. PATENT DOCUMENTS 8,800,843 B2  8/2014 Aoyagi et al.
2011/0146408 A1* 6/2011 Aoyagi ............... B23K 20/007
73/588
(Continued)

FOREIGN PATENT DOCUMENTS

JP  2008060210     3/2008
JP  4314313 B1 *  8/2009  ........... B23K 20/007
(Continued)

OTHER PUBLICATIONS

Harkness et al. "A design approach for longitudinal-torsional ultrasonic transducers", Sensors and Actuators, issue 198, p. 99-106. (Year: 2013).*
(Continued)

*Primary Examiner* — Devang R Patel
(74) *Attorney, Agent, or Firm* — JCIPRNET

(57) ABSTRACT

The present invention includes: an ultrasonic horn (14) to which two ultrasonic vibrations can be input to excite a capillary (15) mounted to a front end with different frequencies in a Y-direction and an X-direction; and a control unit (50) which adjusts the respective magnitude of the two ultrasonic vibrations. The Y-direction is a direction in which the ultrasonic horn (14) extends. The control unit (50) adjusts the respective magnitude of the two ultrasonic vibrations to adjust a ratio ($\Delta Y/\Delta X$) of amplitude of the capillary (15) in the Y-direction and the X-direction. Thus, degradation in the quality of the joining between wires and leads is suppressed.

11 Claims, 17 Drawing Sheets

(51) Int. Cl.
  *B23K 20/10* (2006.01)
  *B06B 1/06* (2006.01)
  *B23K 20/00* (2006.01)
  *B23K 101/40* (2006.01)

(52) U.S. Cl.
  CPC ............ *B23K 20/004* (2013.01); *B23K 20/10* (2013.01); *B06B 2201/72* (2013.01); *B23K 2101/40* (2018.08); *H01L 2224/78355* (2013.01); *H01L 2224/78901* (2013.01); *H01L 2224/78925* (2013.01)

(56) References Cited

U.S. PATENT DOCUMENTS

| | | | |
|---|---|---|---|
| 2012/0125977 | A1 | 5/2012 | DeAngelis et al. |
| 2018/0240774 | A1* | 8/2018 | DeAngelis .............. H01L 24/75 |
| 2018/0345318 | A1* | 12/2018 | Miura ...................... B06B 3/00 |

FOREIGN PATENT DOCUMENTS

| | | |
|---|---|---|
| JP | 2013003821 | 1/2013 |
| JP | 2013506271 | 2/2013 |
| JP | 6180736 | 8/2017 |
| TW | 201000238 | 1/2010 |
| WO | 2017094558 | 6/2017 |

OTHER PUBLICATIONS

Schemmel et al. "Using complex multi-dimensional vibration in ultrasonic bonding and welding", Sensors and Actuators, issue 295, p. 653-662. (Year: 2019).*

Tsujino et al., "New methods of ultrasonic welding of metal and plastic materials", Ultrasonics, issue 34, p. 177-185. (Year: 1996).*

"International Search Report (Form PCT/ISA/210)" of PCT/JP2019/027437, dated Aug. 27, 2019, with English translation thereof, pp. 1-4.

* cited by examiner

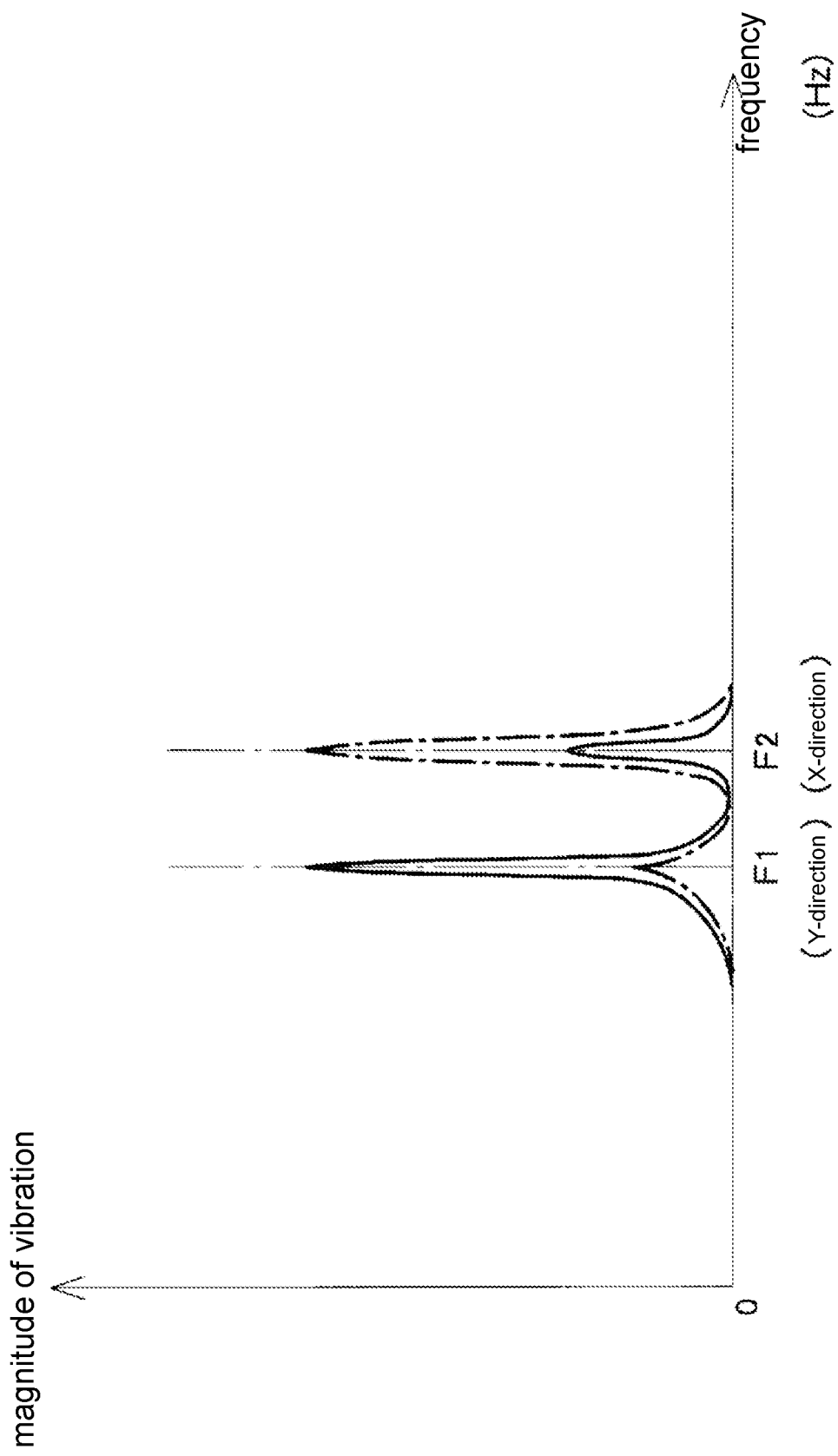

WIRE BONDING APPARATUS

CROSS-REFERENCE TO RELATED APPLICATION

This application is a 371 application of the International PCT application serial no. PCT/JP2019/027437, filed on Jul. 11, 2019, which claims the priority benefits of Japan Patent Application No. 2018-131165, filed on Jul. 11, 2018. The entirety of each of the above-mentioned patent applications is hereby incorporated by reference herein and made a part of this specification.

BACKGROUND

Technical Field

The present invention relates to a structure of a wire bonding apparatus.

Related Art

A wire bonding apparatus in which an electrode of a semiconductor die and a lead of a lead frame are connected by a wire is frequently used. After ultrasonically vibrating a capillary in a state that the wire is pressed against the electrode by the capillary and joining the wire and the electrode, the wire bonding apparatus sets up the wire to the lead, ultrasonically vibrates the capillary in a state that the set-up wire is pressed against the lead, and connects the wire with the lead (for example, see Patent literature 1).

In the wire bonding apparatus described in Patent literature 1, the direction of the ultrasonic vibration of the capillary is an extending direction (Y-direction) of an ultrasonic horn. Meanwhile, leads are radially disposed around the semiconductor die, and thus an extending direction of the lead and the direction of the ultrasonic vibration of the capillary do not match in some cases. In this case, there is a problem that the wire which is set up between the electrode and the lead will resonate due to the ultrasonic vibration when the wire is connected to the lead, and a junction portion between the electrode of the semiconductor die and the wire will be peeled off. Therefore, in Patent literature 1, a method is proposed in which a placement table of the semiconductor die is rotated or one capillary is vibrated in an XY-direction by two ultrasonic horns, and thereby the direction of the ultrasonic vibration is matched with an extending direction of the wire from the electrode toward the lead.

In addition, recently, a bonding apparatus is proposed which performs an XY mixture excitation that ultrasonically vibrates the capillary not only in the Y-direction but also in an X-direction perpendicular to the Y-direction at the same time (for example, see Patent literatures 2 and 3).

LITERATURE OF RELATED ART

Patent Literature

Patent literature 1: Japanese Patent Laid-open No. 2008-60210
Patent literature 2: International Application Publication No. 2017/094558 Pamphlet
Patent literature 3: Japanese Patent No. 6180736

SUMMARY

Problems to be Solved

However, recently, because of requirement of miniaturization of IC, the width of the lead tends to be narrow. With the lead having a narrow width, if the extending direction of the lead and the direction of the ultrasonic vibration of the capillary are different, the lead will be deformed because of a force applied in a width direction of the lead by the ultrasonic vibration, and the quality of the joining between the wire and the lead will degrade in some cases. In this case, with the method described in Patent literature 1 in which the placement table of the semiconductor die is rotated or one capillary is vibrated in the XY-direction by two ultrasonic horns, there is a problem that the structure will be complicated and a tact time of bonding will be long. In addition, with the bonding apparatus described in Patent literatures 2 and 3, although an XY mixture excitation is performed, a relationship between the extending direction of the lead and the direction of the ultrasonic vibration is not considered, and there is a problem that the deformation of the lead caused by the ultrasonic excitation will be generated and the quality of the joining will degrade.

Therefore, the present invention aims to suppress degradation in the quality of the joining between wires and electrodes by a simple configuration.

Means to Solve Problems

A wire bonding apparatus of the present invention includes: an ultrasonic horn to which two ultrasonic vibrations can be input to excite a bonding tool mounted to a front end with different frequencies in a Y-direction and an X-direction perpendicular to the Y-direction; and a control unit which adjusts the respective magnitude of the two ultrasonic vibrations. The Y-direction is a direction in which the ultrasonic horn extends, and the control unit adjusts the respective magnitude of the two ultrasonic vibrations to adjust a ratio of amplitude of the bonding tool in the Y-direction and the X-direction.

Thus, by a simple configuration, vibration energy which is applied in a width direction of an electrode can be reduced, and degradation in the quality of the joining between wires and electrodes can be suppressed.

In the wire bonding apparatus of the present invention, the bonding tool may connect a wire to a band-shaped electrode which is disposed inclined with respect to the Y-direction. The wire bonding apparatus may include an imaging device which captures an image of the electrode. The control unit may process the image of the electrode captured by the imaging device, calculate an angle of an extending direction of the electrode with respect to the Y-direction, and adjust the respective magnitude of the two ultrasonic vibrations according to the calculated angle. In addition, the control unit may adjust the magnitude of each vibration in a way that the larger the calculated angle, the smaller the ratio of the amplitude of the bonding tool in the Y-direction with respect to the amplitude of the bonding tool in the X-direction.

Thus, vibration energy in the Y-direction which is applied to the electrode by a front end of the bonding tool can be reduced when the angle of the extending direction of the electrode with respect to the Y-direction increased, and degradation in the quality of the joining between wires and electrodes can be suppressed.

In the wire bonding apparatus of the present invention, the control unit may adjust the magnitude of each vibration so that the ratio of the amplitude of the bonding tool in the Y-direction and the X-direction becomes a ratio of the extending direction of the electrode in the Y-direction and the X-direction.

Thus, an extending direction of a diagonal line of a vibration range of the front end of the bonding tool is the extending direction of the electrode, a direction of energy of the ultrasonic vibration which is input to the electrode can be taken as the extending direction of the electrode, deformation of the electrode can be suppressed, and degradation in the quality of the joining can be suppressed.

In the wire bonding apparatus of the present invention, the control unit may process the image of the electrode captured by the imaging device to calculate a width of the electrode in a direction perpendicular to the extending direction of the electrode, and adjusts the respective magnitude of the two ultrasonic vibrations so that the magnitude of the bonding tool in the direction perpendicular to the extending direction of the electrode does not exceed the calculated width of the electrode.

Thus, the force which is applied in the width direction of the electrode can be further reduced to suppress the deformation of the electrode, and degradation in the quality of the joining between wires and electrodes can be suppressed by a simple configuration.

In the wire bonding apparatus of the present invention, the ultrasonic horn may have a vibration amplification unit and a vibration conversion unit. The vibration amplification unit is connected to an ultrasonic vibrator capable of vibrating at two different frequencies in the Y-direction. The vibration amplification unit amplifies the ultrasonic vibration in the Y-direction input from the ultrasonic vibrator and transmits the amplified ultrasonic vibration to the front end. The vibration conversion unit converts the ultrasonic vibration in the Y-direction to torsional vibration of the ultrasonic horn. The control unit may adjust the magnitude of each vibration of the ultrasonic vibrator. In addition, the vibration amplification unit may have a polygonal shape in a plan view, and the vibration conversion unit may be a slit which is disposed obliquely with respect to the Y-direction. Furthermore, in the wire bonding apparatus of the present invention, a first ultrasonic vibrator which vibrates the ultrasonic horn in the Y-direction and a second ultrasonic vibrator which torsionally vibrates the ultrasonic horn may be connected to the ultrasonic horn, and the control unit may adjust magnitude of the vibration of the first ultrasonic vibrator and magnitude of the vibration of the second ultrasonic vibrator.

The front end of the bonding tool can be vibrated in the XY-direction by a simple configuration.

Effect

The present invention can suppress degradation in the quality of the joining between wires and electrodes by a simple configuration.

BRIEF DESCRIPTION OF THE DRAWINGS

FIG. 4 is a graph showing frequencies of vibrations and amplitudes of vibrations of an ultrasonic vibrator.

DESCRIPTION OF THE EMBODIMENTS

<Configuration of Wire Bonding Apparatus>

Figure 1:
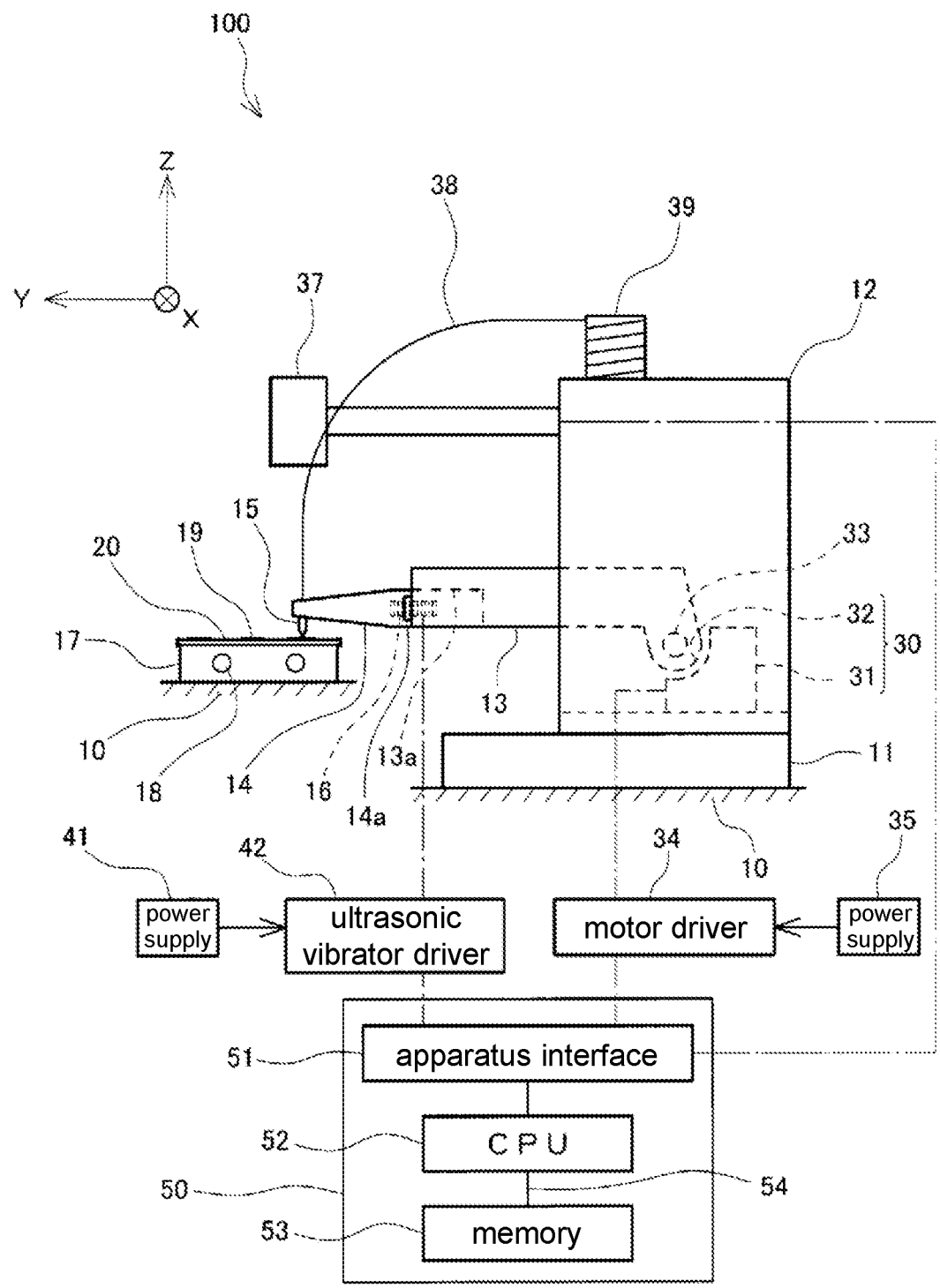
FIG. 1 is a system diagram showing a configuration of a wire bonding apparatus of an embodiment.

Hereinafter, a wire bonding apparatus 100 of an embodiment is described with reference to the drawings. As shown in FIG. 1, the wire bonding apparatus 100 of the embodiment includes: a frame 10, an XY table 11 which is mounted on the frame 10, a bonding head 12 which is mounted on the XY table 11, a bonding arm 13 which is mounted to the bonding head 12, an ultrasonic horn 14 which is mounted to a front end of the bonding arm 13, an ultrasonic vibrator 16 which ultrasonically vibrates the ultrasonic horn 14, a capillary 15 which is a bonding tool mounted to a front end of the ultrasonic horn 14, a heat block 17 which heats and adsorbs a lead frame 20 to which a semiconductor die 19 is mounted, and a control unit 50. Besides, in FIG. 1, an XY-direction indicates a horizontal direction, and a Z-direction indicates an up-down direction.

The bonding head 12 moves in the XY-direction by the XY table 11. A Z-direction motor 30 which drives the bonding arm 13 in the up-down direction (the Z-direction) is arranged inside the bonding head 12. In addition, in an upper portion of the bonding head 12, a camera 37 which is an imaging device which captures an image of the lead frame 20 and a spool 39 which supplies a wire 38 are mounted.

The Z-directed motor 30 is configured by a fixed element 31 which is fixed to the bonding head 12 and a movable element 32 which rotates around a rotation shaft 33. The movable element 32 is integral with a back portion of the bonding arm 13, and when the movable element 32 rotates and moves, the front end of the bonding arm 13 moves in the up-down direction. When the movable element 32 rotates and moves, a front end of the capillary 15 moves up and down in a direction substantially perpendicular to an upper surface of an electrode 19a (shown in FIG. 2) which is a first electrode of the semiconductor die 19. A flange 14a of the ultrasonic horn 14 is fixed to the front end of the bonding arm 13 by a bolt. In addition, on a surface on a lower side of the front end part of the bonding arm 13, a recessed portion 13a which accommodates the ultrasonic vibrator 16 is arranged.

The capillary 15 is mounted to the front end of the ultrasonic horn 14. The capillary 15 has a cylindrical shape in which a hole for allowing the wire 38 to pass through is arranged in the center, and an outer diameter becomes smaller toward the front end of the capillary 15. The heat block 17 is mounted on the frame 10. A heater 18 which heats the heat block 17 is mounted to the heat block 17, and the lead frame 20 is adsorbed and fixed to an upper surface of the heat block 17.

Driving electric power is supplied from a power supply 35 to the fixed element 31 of the Z-direction motor 30 via a motor driver 34. In addition, driving electric power is supplied from a power supply 41 to the ultrasonic vibrator 16 via an ultrasonic vibrator driver 42.

The control unit 50 is a computer including therein a CPU 52 which performs a computation processing, a memory 53 which stores control programs, data and the like, and an apparatus interface 51 which performs input/output with an apparatus. The CPU 52, the memory 53, and the apparatus interface 51 are connected by a data bus 54.

The ultrasonic vibrator 16 and the Z-direction motor 30 are connected to the control unit 50 respectively via the ultrasonic vibrator driver 42 and the motor driver 34, and the ultrasonic vibrator 16 and the Z-direction motor 30 operate according to instructions of the control unit 50. In addition, the camera 37 is also connected to the control unit 50, and an image captured by the camera 37 is input to the control unit 50.

Figure 2:
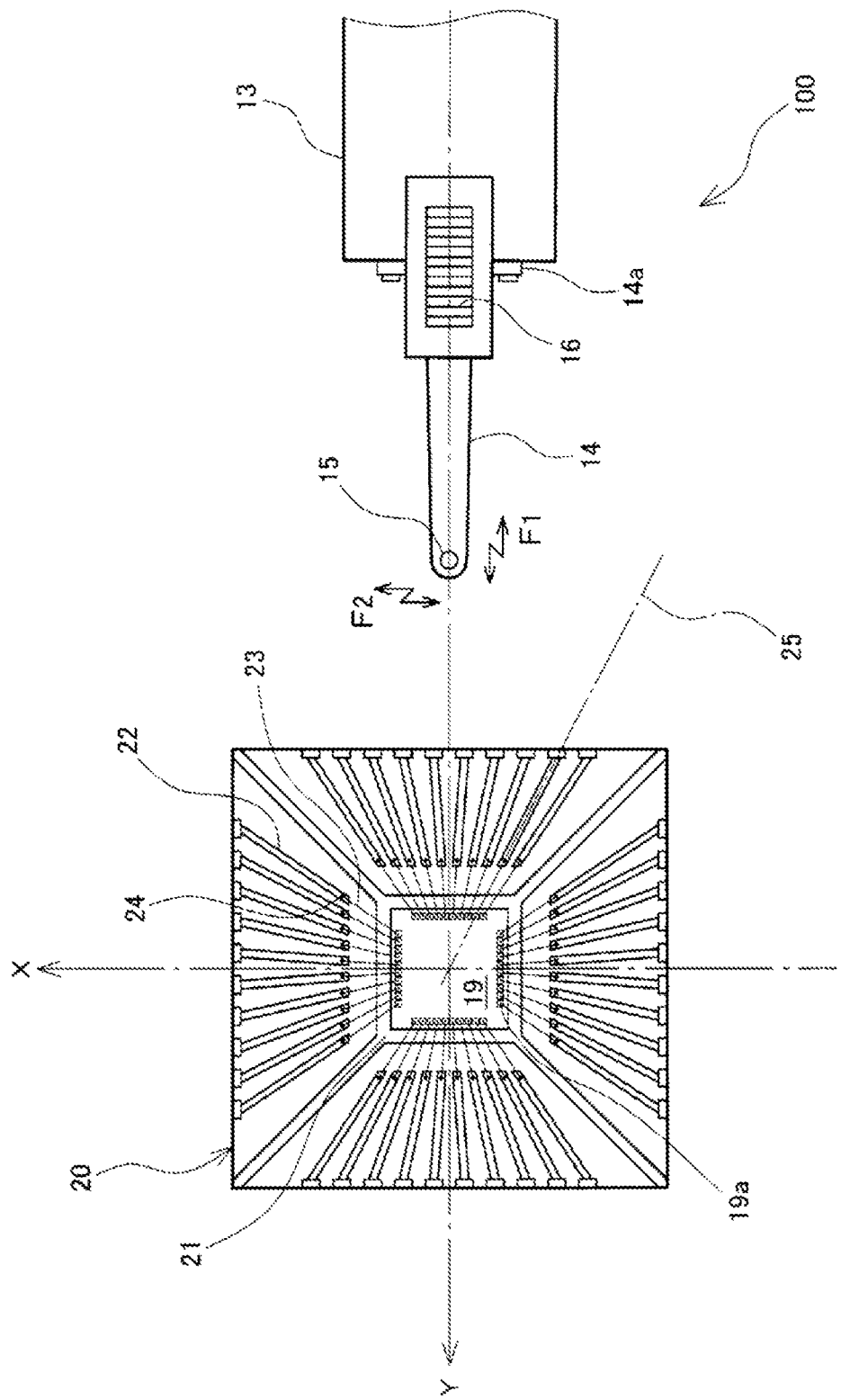
FIG. 2 is a plan view showing a positional relationship among an ultrasonic horn of the wire bonding apparatus shown in FIG. 1, a lead frame to which a semiconductor die is mounted, and a wire which connects an electrode of the semiconductor die with a lead of the lead frame.

As shown in FIG. 2, the lead frame 20 is configured by an island 21 which is disposed in the center and to which the semiconductor die 19 is mounted, and leads 22 which are band-shaped second electrodes radially disposed around the island 21. When the semiconductor die 19 is mounted on the island 21, the leads 22 come into a state of being radially disposed around the semiconductor die 19.

In FIG. 2, the Y-direction indicates an extending direction of the ultrasonic horn 14, and the X-direction indicates a direction perpendicular to the Y-direction. In addition, a dot-and-dash line indicates an extending direction 25 of the lead 22. As shown in FIG. 2, the extending direction of the lead 22 is inclined with respect to the Y-direction. In addition, the ultrasonic vibrator 16 is incorporated into the ultrasonic horn 14 as shown in FIG. 2.

<Basic Wire Bonding Operation>

Hereinafter, with reference to FIG. 3A to FIG. 3D, wire bonding processes are briefly described in which the electrode 19a of the semiconductor die 19 and a second bonding point 24 of the lead 22 of the lead frame 20 is connected using the wire 38 by the wire bonding apparatus 100 shown in FIG. 1.

Figure 3A:
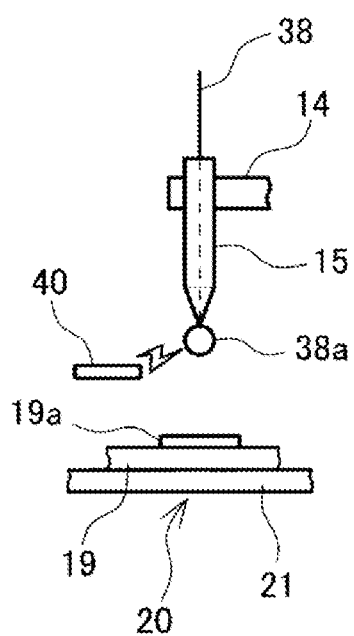
FIG. 3A is an explanatory diagram showing a bonding operation performed by the wire bonding apparatus shown in FIG. 1.

As shown in FIG. 3A, a front end of the wire 38 penetrating through the capillary 15 is formed into a spherical free air ball 38a. Formation of the free air ball 38a is performed by the heat which is obtained in a way that a spark is generated between a torch electrode 40 and the front end of the wire 38 extended from the front end of the capillary 15. In addition, the lead frame 20 to which the semiconductor die 19 is mounted is adsorbed and fixed to the heat block 17 and is heated to a predetermined temperature by the heater 18.

Figure 3B:
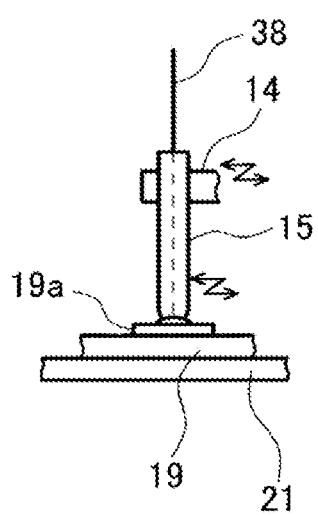
FIG. 3B is an explanatory diagram showing a bonding operation performed by the wire bonding apparatus shown in FIG. 1.

Next, as shown in FIG. 3B, the Z-direction motor 30 is driven to rotate the bonding arm 13, and the front end of the capillary 15 is lowered toward the electrode 19a of the semiconductor die 19. Then, the free air ball 38a is pressed on the electrode 19a of the semiconductor die 19, and at the same time, electric power in alternating directions is supplied to the ultrasonic vibrator 16, the ultrasonic horn 14 generates resonance, and the capillary 15 mounted to the front end of the ultrasonic horn 14 is ultrasonically vibrated. The free air ball 38a and the electrode 19a of the semiconductor die 19 are joined by the pressing of the free air ball 38a to the electrode 19a by the capillary 15 and the ultrasonic vibration.

Figure 3C:
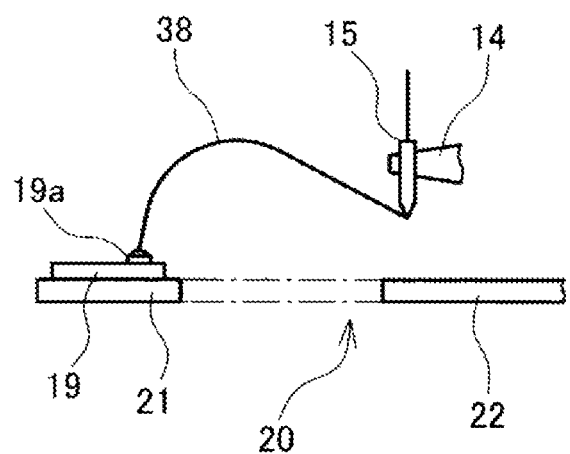
FIG. 3C is an explanatory diagram showing a bonding operation performed by the wire bonding apparatus shown in FIG. 1.
Figure 3D:
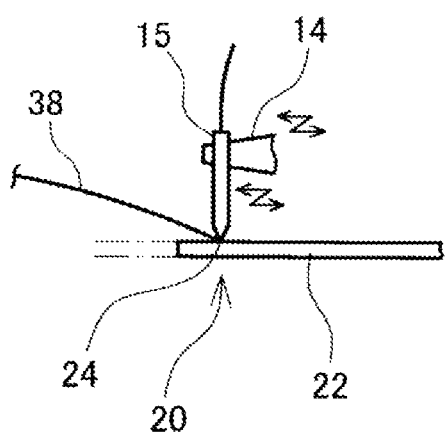
FIG. 3D is an explanatory diagram showing a bonding operation performed by the wire bonding apparatus shown in FIG. 1.

As shown in FIG. 3C, after the free air ball 38a is joined to the electrode 19a of the semiconductor die 19, the wire 38 is looped while being fed out, and the capillary is moved to the above of the lead 22 of the lead frame 20. Then, as shown in FIG. 3D, the capillary 15 is lowered, and the wire 38 is pressed against the second bonding point 24 of the lead 22. In addition, at the same time, electric power in alternating directions is supplied to the ultrasonic vibrator 16, and the capillary 15 is ultrasonically vibrated. In this way, the wire 38 is joined to the second bonding point 24 of the lead 22 by a press load and the ultrasonic vibration.

After joining to the second bonding point 24 is finished, the wire 38 is cut on an upper surface of the second bonding point 24. The wire 38, which connects the electrode 19a of the semiconductor die 19 with the second bonding point 24 of the lead 22, becomes a connection wire 23 shown in FIG. 2. When all the electrodes 19a of the semiconductor die 19 and the second bonding points 24 of all the leads 22 are connected by the connection wires 23, a bonding operation performed to the semiconductor die 19 is finished.

<Ultrasonic Vibrations of Ultrasonic Vibrator and Ultrasonic Horn>

Next, ultrasonic vibrations of the ultrasonic vibrator 16 and the ultrasonic horn 14 are described in detail with reference to FIG. 2 and FIG. 4.

The ultrasonic vibrator 16 shown in FIG. 2 can vibrate with two different frequencies F1 and F2 as shown in FIG. 4. If the ultrasonic vibrator 16 vibrates with the frequency F1, the ultrasonic horn 14 will resonate in a way of expanding and contracting in the Y-direction which is an axial direction of the ultrasonic horn 14 shown in FIG. 2, and the front end of the capillary 15 at the front end of the ultrasonic horn 14 will vibrate in the Y-direction. In addition, if the ultrasonic vibrator 16 vibrates with the frequency F2, the ultrasonic horn 14 will torsionally resonate around the Y axis. Thus, the front end of the capillary 15 vibrates in the X-direction. In this way, with regard to the ultrasonic horn 14, two ultrasonic vibrations with the frequencies F1 and F2 are input from the ultrasonic vibrator 16, and the front end of the capillary 15 can be excited in the XY-direction.

Figure 5A:
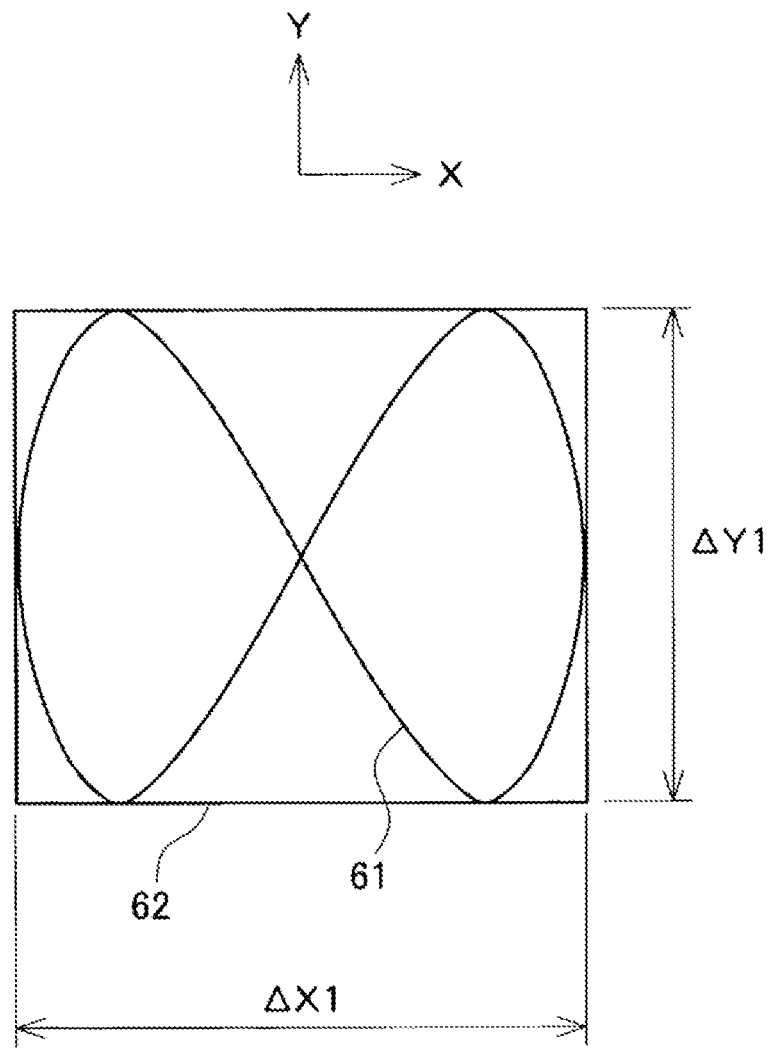
FIG. 5A is a diagram showing a vibration trace of a front end of a capillary.
Figure 5B:
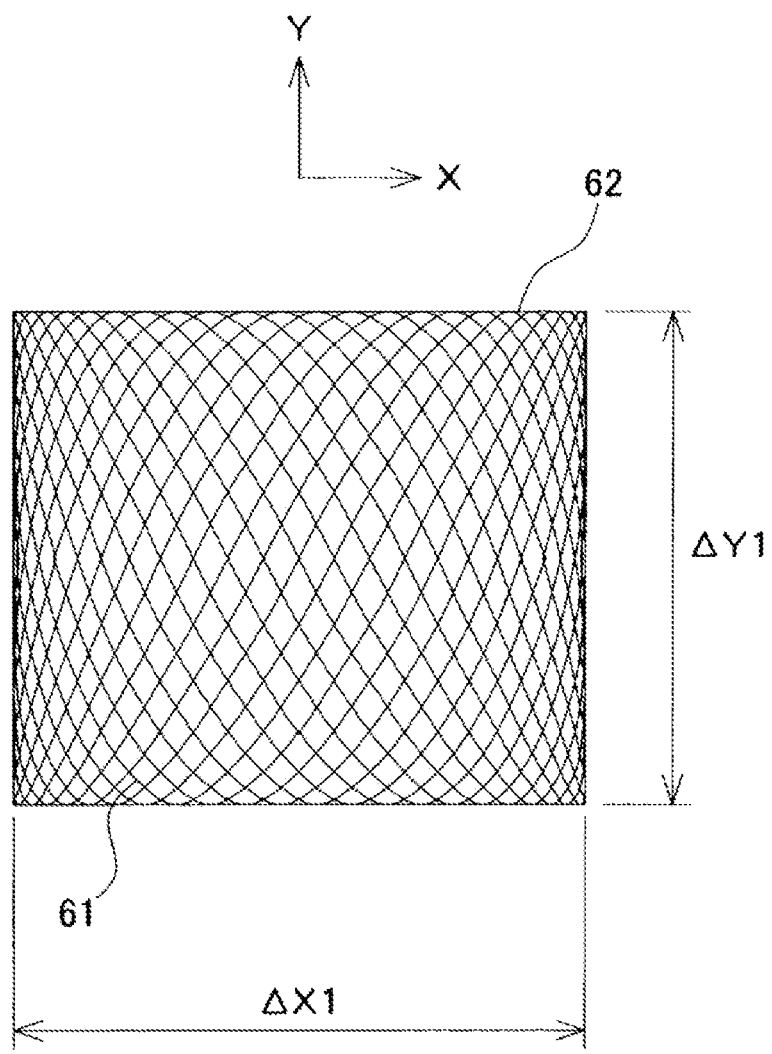
FIG. 5B is a diagram showing a vibration range of the front end of the capillary.
Figure 6:
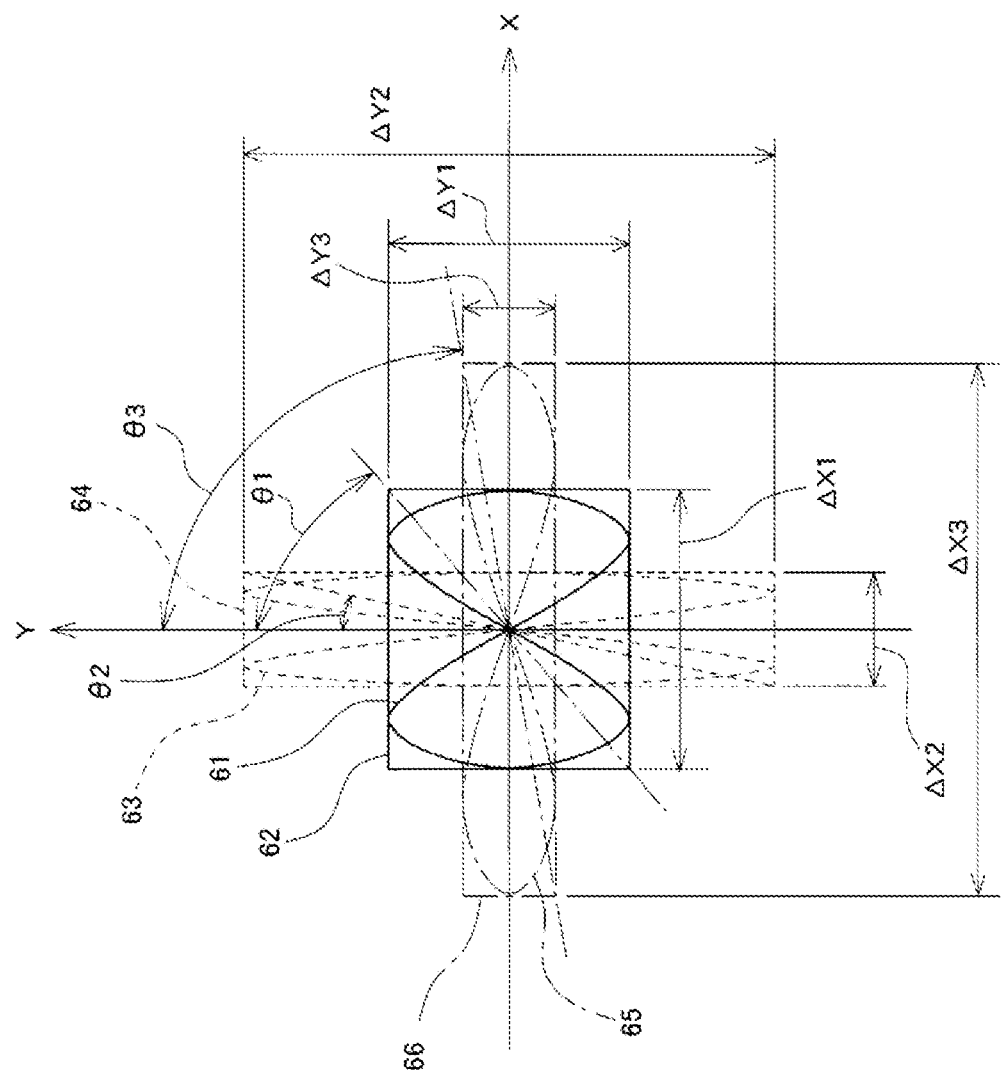
FIG. 6 is a diagram showing changes of the vibration trace and the vibration range of the front end of the capillary when the amplitudes of the ultrasonic vibrator in an X-direction and a Y-direction are changed.

When the frequencies F1 and F2 are set to, for example, frequencies which are close, such as 150 kHz and 180 kHz, a vibration trace 61 of the front end of the capillary 15 is a Lissajous waveform as shown by solid lines in FIG. 5A and FIG. 6. In addition, when an amplitude $\Delta X1$ in the X-direction and an amplitude $\Delta Y1$ in the Y-direction are the same, as shown by solid lines in FIG. 5B and FIG. 6, a vibration range 62 of the front end is substantially a square.

In this case, an angle θ1 formed by a diagonal line of the vibration range 62 and the Y-direction is 45 degrees.

On the ultrasonic vibrator driver 42 shown in FIG. 1, a first phase synchronization circuit (hereinafter referred to as PLL1) and a second phase synchronization circuit (hereinafter referred to as PLL2) are arranged, wherein the first phase synchronization circuit locks the vibration frequency of the ultrasonic vibrator 16 to the frequency F1, and the second phase synchronization circuit locks the vibration frequency of the ultrasonic vibrator 16 to the frequency F2. The magnitude of the vibration at the frequency F1 (vibration in the Y-direction) shown in FIG. 4 and the magnitude of the vibration at the frequency F2 (vibration in the X-direction) can be adjusted by changing each gain of the PLL1 and the PLL2.

For example, when the gain of the PLL1 is increased and the gain of the PLL2 is reduced, as shown by solid lines in FIG. 4, the magnitude of the vibration at the frequency F1increases, and the magnitude of the vibration at of the frequency F2 decreases. In this case, as shown by dashed lines in FIG. 6, an amplitude ΔY2 of the front end of the capillary 15 in the Y-direction increases, an amplitude ΔX2 in the X-direction decreases, and a vibration trace 63 and a vibration range 64 of the front end become a rectangle elongated in the Y-direction. In this case, an angle θ2 formed by a diagonal line of the vibration range 64 and the Y-direction is smaller than 45 degrees.

On the contrary, when the gain of the PLL1 is reduced and the gain of the PLL2 is increased, as shown by dot-and-dash lines in FIG. 4, the magnitude of the vibration at the frequency F1 decreases, and the magnitude of the vibration at the frequency F2 increases. In this case, as shown by dot-and-dash lines in FIG. 6, an amplitude ΔY3 of the front end of the capillary 15 in the Y-direction decreases, an amplitude ΔX3 in the X-direction increases, and a vibration trace 65 and a vibration range 66 of the front end become a rectangle elongated in the X-direction. In this case, an angle θ3 formed by a diagonal line of the vibration range 66 and the Y-direction is larger than 45 degrees.

Therefore, by adjusting the gains of the PLL1 and the PLL2 of the ultrasonic vibrator driver 42, a ratio of the amplitude ΔY in the Y-direction and the amplitude ΔX in the X-direction of the front end of the capillary 15 (ratio of the amplitude ΔY with respect to the amplitude ΔX=ΔY/ΔX) can be adjusted.

<Function Block of Control Unit>

Figure 7:
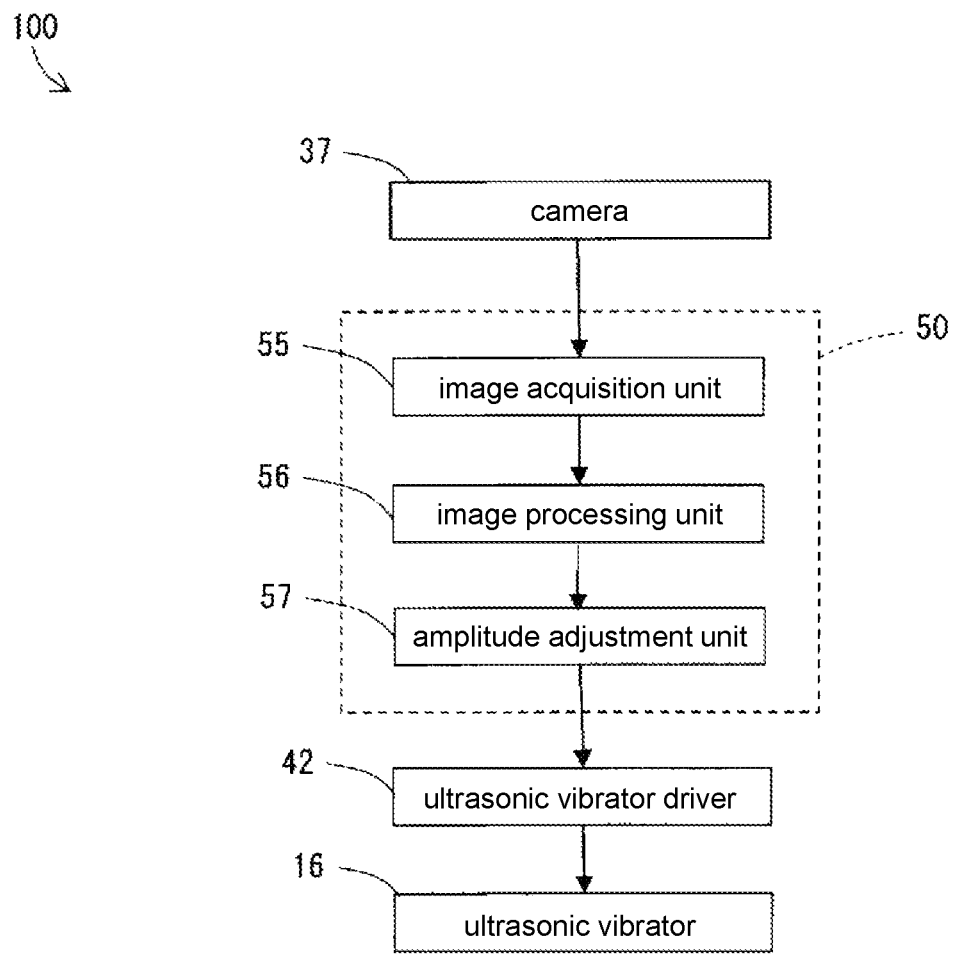
FIG. 7 is a functional block diagram of a control unit of the wire bonding apparatus shown in FIG. 1.

As shown in FIG. 7, the control unit 50 includes three function blocks: an image acquisition unit 55, an image processing unit 56 which processes an image acquired by the image acquisition unit 55 and calculates the extending direction 25 of the lead 22, and an amplitude adjustment unit 57 which adjusts the magnitude of the vibration of the ultrasonic vibrator 16 to adjust the ratio ΔY/ΔX of the amplitude ΔY in the Y-direction and the amplitude ΔX in the X-direction of the front end of the capillary 15. Each of these function blocks is achieved by executing the programs stored in the memory 53.

<Operation of Wire Bonding Apparatus>

Next, operations of the wire bonding apparatus 100 of the embodiment is described with reference to FIG. 8 to FIG. 11.

<Calculation of Extending Direction and Width of Lead>

Figure 8:
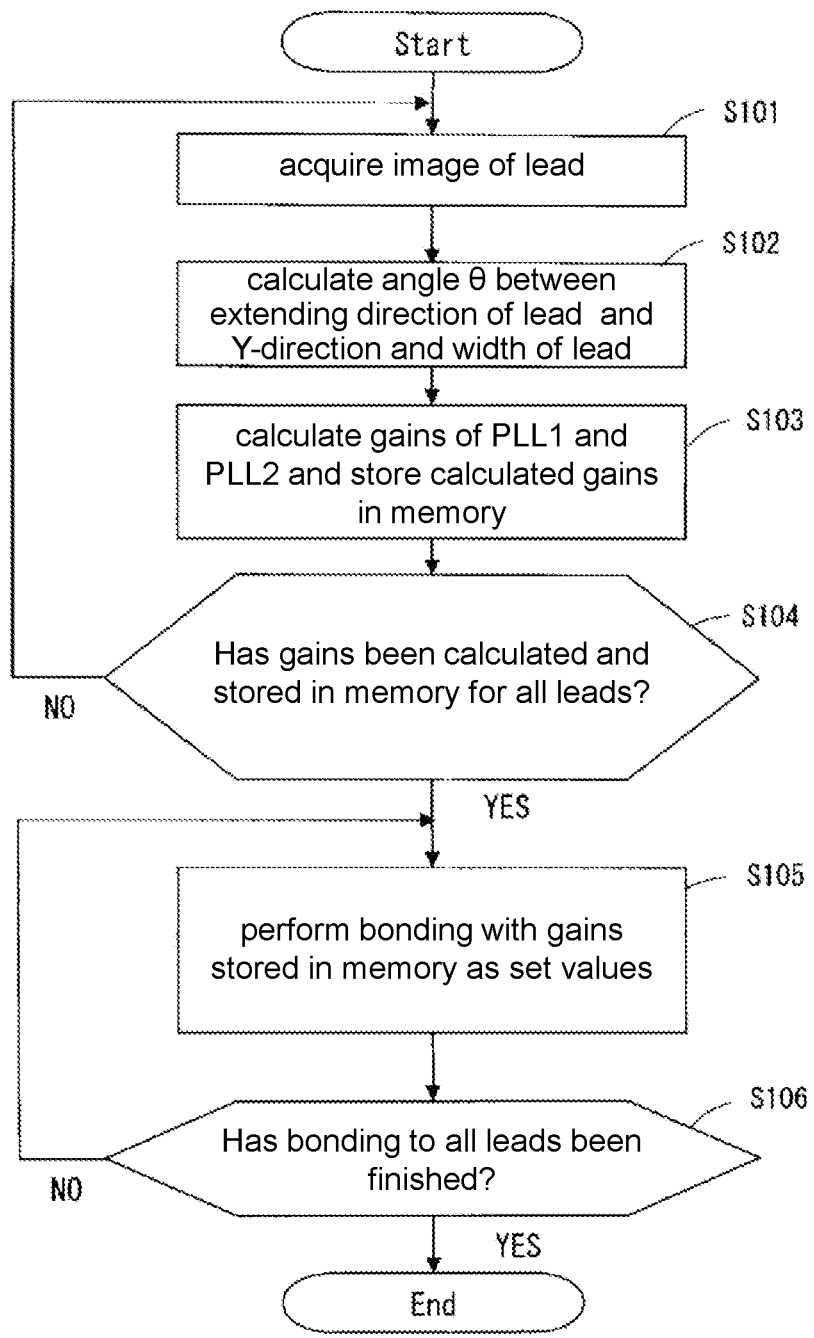
FIG. 8 is a flow chart showing operations of the wire bonding apparatus of the embodiment.
Figure 9:
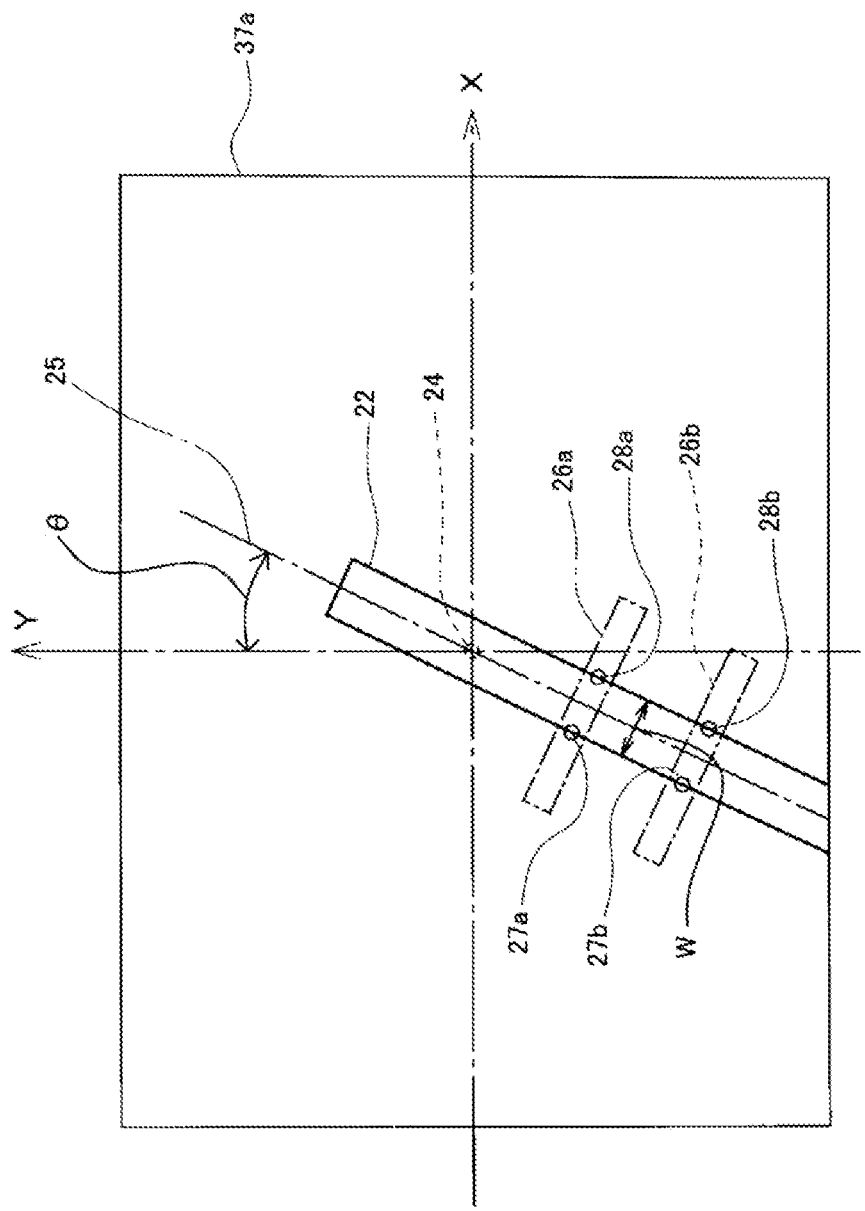
FIG. 9 is a diagram showing an image of the lead which is captured by an imaging device.

As shown in step S101 in FIG. 8, the image acquisition unit 55 acquires the image of the lead frame 20 shown in FIG. 2 by the camera 37 shown in FIG. 1. FIG. 9 is a diagram showing an image of the lead 22 in a viewing field 37a of the camera 37. Besides, if the image of the lead frame 20 is captured by the camera 37, images of a plurality of the leads 22 will be included in the viewing field 37a, but in FIG. 9, only an image of one lead 22 is extracted and described, and illustrations of the images of other leads 22 are omitted. The image acquisition unit 55 outputs the captured image to the image processing unit 56.

As shown in step S102 in FIG. 8, the image processing unit 56 processes the image input from the image acquisition unit 55, and calculates the extending direction 25 of the lead 22 as described below.

As shown in FIG. 9, the image processing unit 56 set two detection ranges 26a and 26b which straddle the lead 22. As shown in FIG. 9, the two detection ranges 26a and 26b are set in a way of being positioned apart from each other in a longitudinal direction of the lead 22.

Next, the image processing unit 56 detects brightness change points in the detection ranges 26a and 26b which are set. Generally, brightness of the part of the lead 22 is high because the surface of the lead 22 is a plane and light is reflected. The part between the leads 22 is a space, and thus light entering this part is reflected by a surface which is positioned below the lead 22, for example, the surface of the heat block 17 or the like, resulting in low brightness in this part. Therefore, in an edge part of the lead 22, brightness changes between a state in which brightness is low and a state in which brightness is high. Therefore, the image processing unit 56 extracts four points as brightness change points, that is, two edges 27a and 28a in a width direction of the lead 22 in the detection range 26a shown in FIG. 9, and two edges 27b and 28b in the width direction of the lead 22 in the detection range 26b.

Then, the image processing unit 56 calculates an angle θ between the extending direction 25 of the lead 22 and the Y-direction using the edge 27a in the detection range 26a and the edge 27b in the detection range 26b which is separated from the detection range 26a. Similarly, the image processing unit 56 calculates an angle θ between the extending direction 25 of the lead 22 and the Y-direction using the edge 28a and the edge 28b. Then, the image processing unit 56 outputs, to the amplitude adjustment unit 57, an average value of the two calculated angles θ as the angle θ between the extending direction 25 of the lead 22 and the Y-direction. Here, the angle θ is an angle of the extending direction 25 of the lead 22 with respect to the Y-direction in FIG. 9 and is in a range of 0°~±90°.

In addition, the image processing unit 56 respectively calculates widths of the lead 22 in a direction perpendicular to the extending direction of the lead 22 from the edges 27a and 28a in the detection range 26a and the edges 27b and 28b in the detection range 26b, and outputs, to the amplitude adjustment unit 57, an average value of the calculated widths of the lead 22 as a width W of the lead 22 in the vicinity of the second bonding point 24 of the lead 22.

<Setting of Gains of PLL1 and PLL2>

Figure 10:
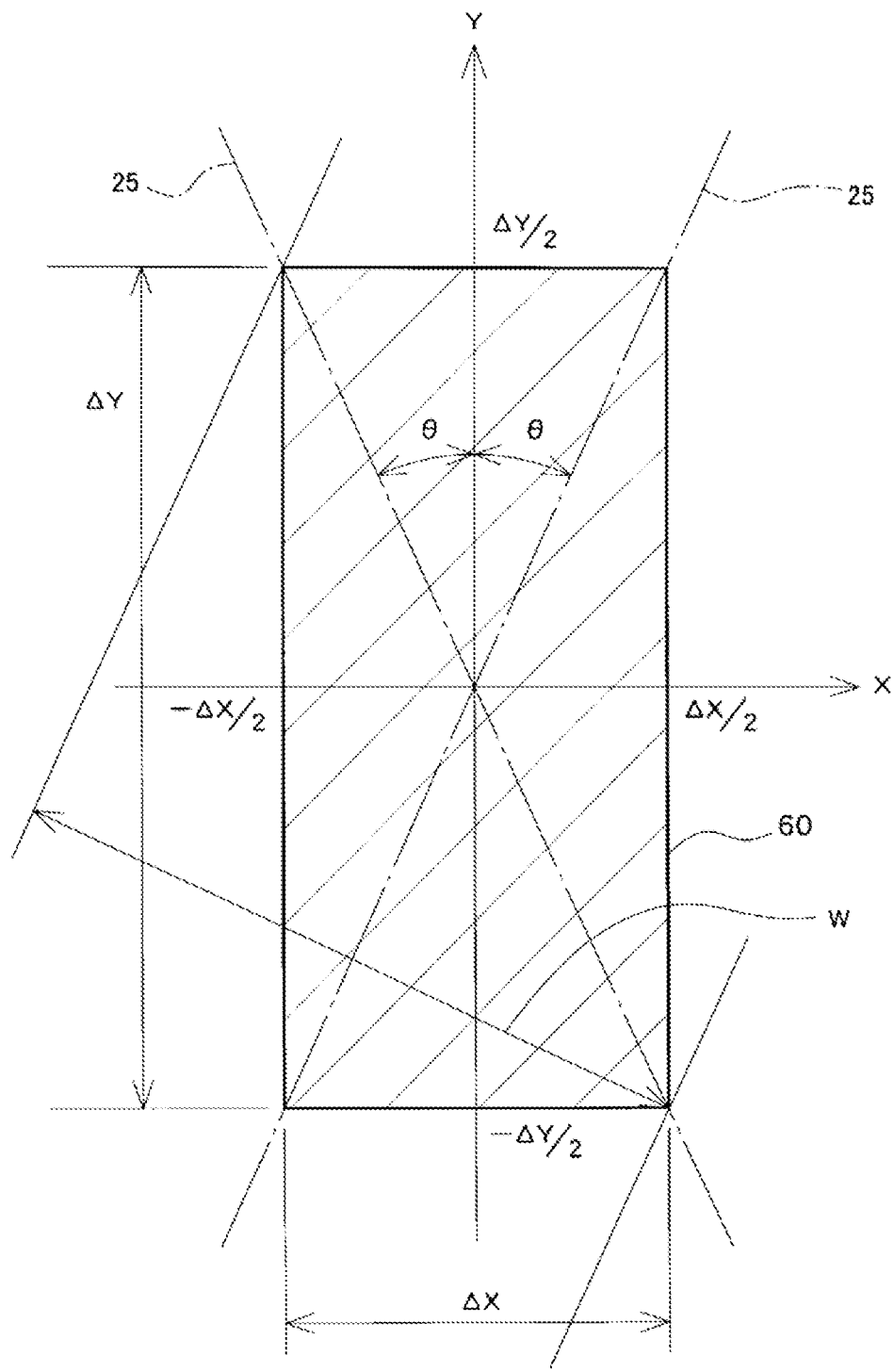
FIG. 10 is a graph showing a relationship among an extending direction of the lead, an amplitude $\Delta X$ of the front end of the capillary in the X-direction, and an amplitude $\Delta Y$ of the front end of the capillary in the Y-direction.

In step S103 in FIG. 8, as shown in FIG. 10, the amplitude adjustment unit 57 calculates a ratio of the gains of the PLL1 and the PLL2 of the ultrasonic vibrator driver 42 when the ratio ΔY/ΔX of the amplitude ΔY of the vibration in the Y-direction and the amplitude ΔX in the X-direction of the front end of the capillary 15 becomes tangent of the absolute value of the angle θ, that is, tan(|θ|), wherein the angle θ between the extending direction 25 of the lead 22 and the Y-direction is input from the image processing unit 56. At this time, a map which specifies a relationship between the amplitude ΔY and the PLL1 and a relationship between the amplitude ΔX and the PLL2 or the like is stored in the memory 53, and the ratio of the PLL1 and the PLL2 may be calculated with reference to this map.

If the ratio of the gains of the PLL1 and the PLL2 is set in this way, as shown in FIG. 10, the ratio (ΔY/ΔX) of the amplitude ΔY in the Y-direction and the amplitude ΔX in the X-direction of the front end of the capillary 15 will be a ratio of the extending direction 25 of the lead 22 in the Y-direction and the X-direction. Then, a vibration range 60 of the front end of the capillary 15 becomes a rectangle, and an extending direction of a diagonal line of the vibration range 60 becomes the extending direction of the lead 22. In addition, the larger the angle θ between the extending direction 25 of the lead 22 and the Y-direction, the smaller the amplitude ΔY in the Y-direction, and the larger the amplitude ΔX in the X-direction. That is, the larger the angle θ, the smaller the ratio of the amplitude ΔY with respect to the amplitude ΔX=ΔY/ΔX.

In addition, based on the detected width W of the lead 22 and the angle θ between the extending direction 25 of the lead 22 and the Y-direction, the amplitude adjustment unit 57 calculates the amplitude ΔX or ΔY at which the vibration range 60 shown in FIG. 10 does not exceed the width W of the lead 22, calculates the gains of the PLL1 and the PLL2 from the calculated amplitude ΔX or ΔY and the ratio of the gains of the PLL1 and the PLL2 which has been calculated before, and stores the calculated gains of the PLL1 and the PLL2 in the memory 53.

When a plurality of the leads 22 are included in the image acquired by the image acquisition unit 55, the image processing unit 56 and the amplitude adjustment unit 57 calculate the gains of the PLL1 and the PLL2 for each lead 22, and store the calculated gains of the PLL1 and the PLL2 in the memory 53. Then, after the gains of the PLL1 and the PLL2 are stored in the memory 53 for all the leads 22 in the image, the next image captured by the image acquisition unit 55 is similarly processed, and the gains of the PLL1 and the PLL2 are stored in the memory 53 for all the leads 22 of the lead frame 20 shown in FIG. 2. In this way, the image acquisition unit 55, the image processing unit 56, and the amplitude adjustment unit 57 repeatedly perform step S101 to step S104 shown in FIG. 8 until the gains of the PLL1 and the PLL2 are stored in the memory 53 for all the leads 22. Then, after the gains of the PLL1 and the PLL2 are stored in the memory 53 for all the leads 22, it is determined to be YES in step S104, the operation moves on to step S105 in FIG. 8, and a bonding operation for the lead frame 20 is started.

<Bonding Operation>

The bonding operation is an operation similar to the wire bonding operation described before with reference to FIG. 3A to FIG. 3D, but when bonding is performed to the second bonding point 24 of the lead 22 shown in FIG. 3C, the control unit 50 reads the gains of the PLL1 and the PLL2 for each lead 22 stored in the memory 53 and operates the ultrasonic vibrator 16.

Figure 11:
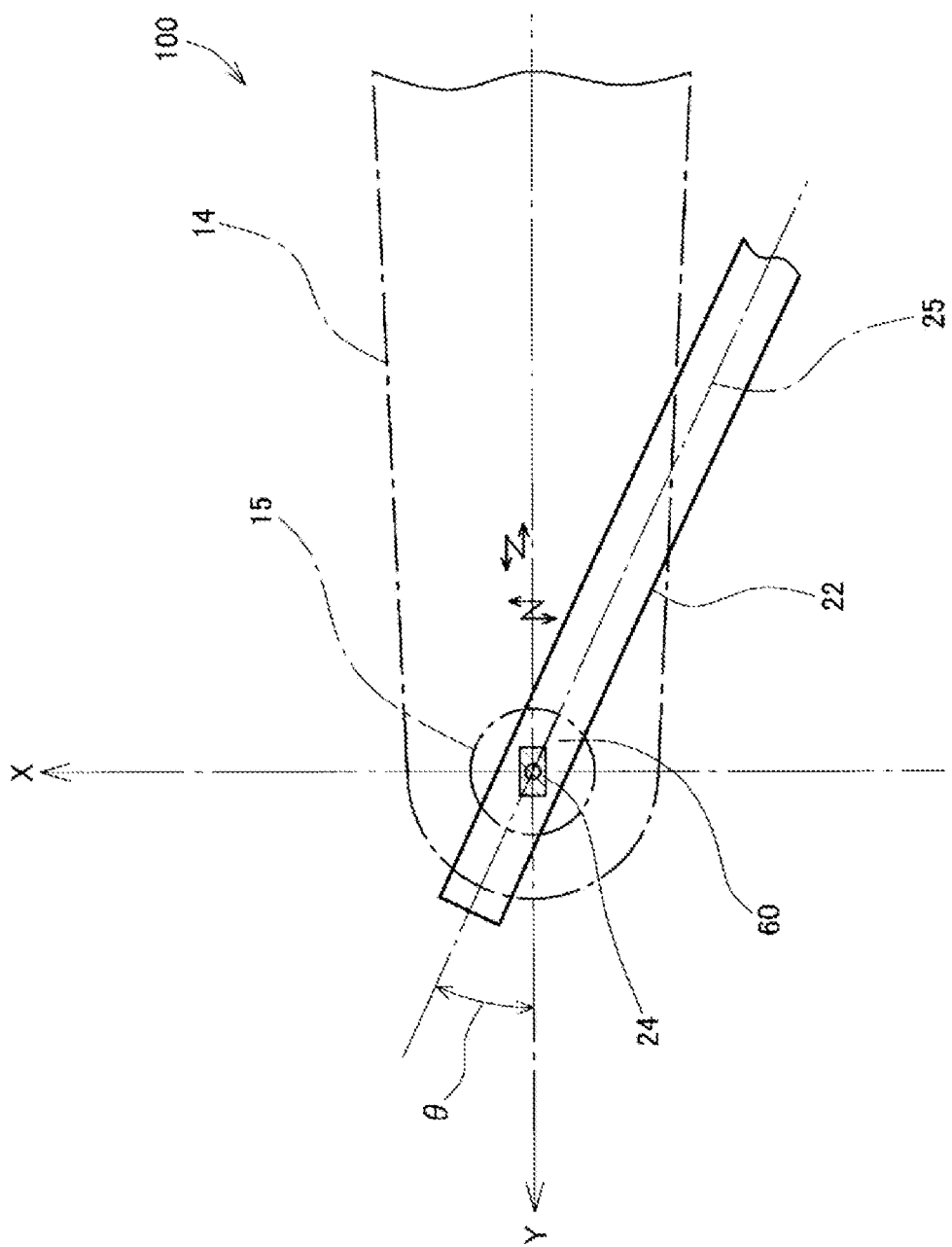
FIG. 11 is a plan view showing a vibration range of the front end of the capillary when the wire is joined to the lead by the bonding apparatus of the embodiment.

As described before, the gains of the PLL1 and the PLL2 for each lead 22 stored in the memory 53 are set so that the ratio (ΔY/ΔX) of the amplitude ΔY in the Y-direction and the amplitude ΔX in the X-direction of the front end of the capillary 15 becomes the ratio of the extending direction 25 of the lead 22 in the Y-direction and the X-direction. Therefore, when the ultrasonic vibrator 16 is operated using the gains of the PLL1 and the PLL2 read from the memory 53, as shown in FIG. 11, the extending direction of the diagonal line of the vibration range 60 of the front end of the capillary 15 becomes the extending direction 25 of the lead 22.

The control unit 50 keeps performing the bonding operation until the bonding to all the leads 22 is finished in step S106 in FIG. 8, and execution of the program is finished when the bonding to all the leads 22 is finished.

The wire bonding apparatus 100 of the embodiment sets the gains of the PLL1 and the PLL2 for each lead 22 so that the ratio (ΔY/ΔX) of the amplitude ΔY in the Y-direction and the amplitude ΔX in the X-direction of the front end of the capillary 15 becomes the ratio of the extending direction 25 of the lead 22 in the Y-direction and the X-direction. Thus, the extending direction of the diagonal line of the vibration range 60 of the front end of the capillary 15 becomes the extending direction 25 of the lead 22. Therefore, the direction of energy of the ultrasonic vibration which is input to the lead 22 can be taken as the extending direction of the lead 22, deformation of the lead 22 caused by the ultrasonic vibration can be suppressed, and degradation in the quality of the joining can be suppressed.

In addition, with regard to the wire bonding apparatus 100 of the embodiment, the larger the angle θ between the extending direction 25 of the lead 22 and the Y-direction, the smaller the amplitude ΔY in the Y-direction, and the larger the amplitude ΔX in the X-direction. Therefore, the larger the angle θ, the smaller the vibration energy in the Y-direction which is applied by the front end of the capillary 15 to the lead 22. Then, when the angle θ becomes 90°, the amplitude ΔY in the Y-direction becomes zero, and the vibration energy which is applied in the width direction of the lead 22 can be zero. Thus, energy which is applied in the width direction of the lead 22 when the wire 38 is joined to the lead 22 can be reduced, the deformation of the lead 22 can be suppressed, and degradation in the quality of the joining between of the wire 38 and the lead 22 can be further suppressed.

In addition, the wire bonding apparatus 100 of the embodiment sets the gains of the PLL1 and the PLL2 for each lead 22 so that the amplitude in the width direction of the lead 22 does not exceed the width of the lead 22. Thus, the front end of the capillary 15 can be suppressed from deviating from the lead 22 and deforming the lead 22 during the bonding. Thus, degradation in the quality of the joining between of the wire 38 and the lead 22 can be further suppressed.

In the embodiment described above, it is described that the electrode 19a of the semiconductor die 19 and the lead 22 of the lead frame 20 are connected by the wire 38, but the present invention is not limited to this, and can be applied to a case in which the electrode 19a of the semiconductor die 19 and band-shaped electrodes 19a radially disposed on a substrate around the semiconductor die 19 are connected. Furthermore, instead of the case of a substrate, the present invention can also be applied when connecting an electrode of each layer and an electrode of another layer of a laminated semiconductor in which the semiconductor dies 19 are laminated. In addition, as the bonding tool, the capillary 15 is described as an example, but the bonding tool is not limited to the capillary 15 and the present invention can also be applied to wire bonding which uses, for example, a wedge tool or the like.

In addition, in the embodiment described above, it is described that the gains of the PLL1 and the PLL2 for each lead 22 are set so that the ratio (ΔY/ΔX) of the amplitude ΔY in the Y-direction and the amplitude ΔX in the X-direction of the front end of the capillary 15 becomes the ratio of the extending direction 25 of the lead 22 in the Y-direction and the X-direction, but the present invention is not limited to this, and the ratio ΔY/ΔX of the amplitude ΔY with respect to the amplitude ΔX may decrease when the angle θ between the extending direction 25 of the lead 22 and the Y-direction increases. In this case, the map which specifies the ΔY/ΔX with respect to the angle θ may be stored in the memory 53, and the gains of the PLL1 and the PLL2 for each lead 22 may be set with reference to this map.

In addition, in the embodiment, it is described that the gains of the PLL1 and the PLL2 are calculated based on the detected width W of the lead 22 and the angle θ between the extending direction 25 of the lead 22 and the Y-direction so that the vibration range 60 does not exceed the width W of the lead 22, but the present invention is not limited to this. For example, when the width W of the lead 22 is previously known, the PLL1 and the PLL2 may be calculated by the angle θ using the width W which is known, or the maximum value of the PLL1 and the PLL2 may be set according to the width W, and the PLL1 and the PLL2 may be set so as not to exceed the maximum value.

Next, a wire bonding apparatus 200 of another embodiment is described with reference to FIG. 12. With regard to the wire bonding apparatus 200, only the structure of an ultrasonic horn 71 is different from the ultrasonic horn 14 of the wire bonding apparatus 100 described before, the other parts are the same as the wire bonding apparatus 100, and thus illustrations and descriptions of the other parts are omitted.

Figure 12:
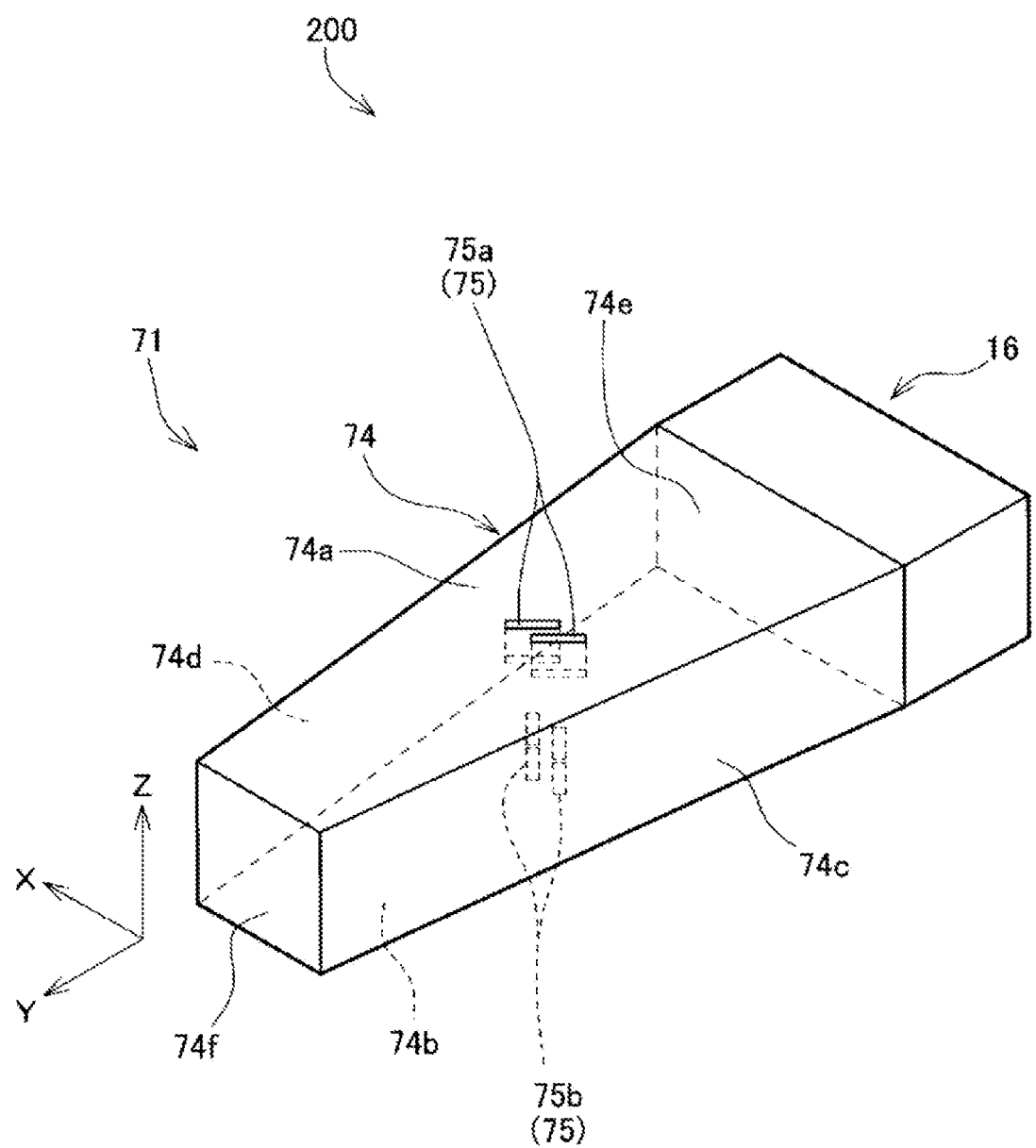
FIG. 12 is a perspective view showing a configuration of an ultrasonic horn of a bonding apparatus of another embodiment.

As shown in FIG. 12, the ultrasonic vibrator 16 which can vibrate with two different frequencies F1 and F2 in the Y-direction is connected to the ultrasonic horn 71 of the wire bonding apparatus 200 of the embodiment, and the ultrasonic horn 71 has a vibration amplification unit 74 and a vibration conversion unit 75, wherein the vibration amplification unit 74 amplifies the ultrasonic vibration in the Y-direction input from the ultrasonic vibrator 16 and transmits the amplified ultrasonic vibration to the front end, and the vibration conversion unit 75 converts the ultrasonic vibration in the Y-direction to torsional vibration of the ultrasonic horn 71. The vibration amplification unit 74 has a quadrangular shape in a plan view, and the vibration conversion unit 75 is configured by upper-side slits 75a and lower-side slits 75b which are disposed obliquely with respect to the Y-direction. Besides, as long as the vibration amplification unit 74 has a polygonal shape in a plan view, the vibration amplification unit 74 is not limited to the quadrangular shape and may be hexagonal or octagonal.

As shown in FIG. 12, the vibration amplification unit 74 has a quadratic prism-like shape which has an upper surface 74a and a bottom surface 74b with an isosceles trapezoidal shape in a top view and in which the cross section is solid. On the upper surface 74a and the bottom surface 74b, two upper-side slits 75a and two lower-side slits 75b which constitute the vibration conversion unit 75 are formed. In addition, the vibration amplification unit 74 has side surfaces 74c and 74d, a back end surface 74e, and a front end surface 74f, all of which are surfaces with no vibration conversion unit 75 formed thereon. The ultrasonic vibrator 16 is mounted to the back end surface 74e. The vibration amplification unit 74 has a tapered shape which is tapered toward the front end surface 74f along the Y-direction, and is configured to amplify the amplitude in the Y-direction transmitted from the ultrasonic vibrator 16.

The upper-side slits 75a and the lower-side slits 75b are arranged at positions which are nodes of the vibration in the Y-direction of the vibration amplification unit 74. Each of the slits 75a and 75b has the same depth and width and does not penetrate the vibration amplification unit 74, and the largest depth of each of the slits 75a and 75b is smaller than ½ of a thickness of the vibration amplification unit 4 in the up-down direction.

If ultrasonic vibrations with the two frequencies F1 and F2 are input to the ultrasonic horn 71 from the ultrasonic vibrator 16, the vibration in the Y-direction will be amplified in the vibration amplification unit 74. Then, if the vibration in the Y-direction passes through the vibration conversion unit 75, a part of the vibration in the Y-direction will be converted to a torsional vibration around an axis in the Y-direction.

Here, by the structure of the vibration conversion unit 75, a percentage to convert the vibration in the Y-direction with one of the frequencies F1 and F2 to the torsional vibration can be adjusted. For example, when a percentage to convert the vibration in the Y-direction with the frequency F2 to the torsional vibration is increased, and a percentage to convert the vibration in the Y-direction with the frequency F1 to the torsional vibration is reduced, similar to the embodiment described before, the gain of the PLL1 and the gain of the PLL2 can be adjusted to thereby adjust the ratio ΔY/ΔX of the amplitude ΔY in the Y-direction and the amplitude ΔX in the X-direction of the front end of the capillary 15.

Therefore, similar to the wire bonding apparatus 100 described before, the wire bonding apparatus 200 of the embodiment sets the gains of the PLL1 and the PLL2 for each lead 22 so that the ratio (ΔY/ΔX) of the amplitude ΔY in the Y-direction and the amplitude ΔX in the X-direction of the front end of the capillary 15 becomes the ratio of the extending direction 25 of the lead 22 in the Y-direction and the X-direction, and thereby the extending direction of the diagonal line of the vibration range 60 of the front end of the capillary 15 can be taken as the extending direction 25 of the lead 22. In addition, when the angle θ between the extending direction 25 of the lead 22 and the Y-direction increases, the amplitude ΔY in the Y-direction can be reduced, and the amplitude ΔX in the X-direction can be increased. Thus, the deformation of the lead 22 caused by the ultrasonic vibration can be suppressed, and degradation in the quality of the joining can be suppressed.

Next, a wire bonding apparatus 300 of another embodiment is described with reference to FIGS. 13 and 14. With regard to the wire bonding apparatus 300 of the embodiment, the ultrasonic vibrator 16 of the wire bonding apparatus 100 described before is changed to an ultrasonic vibrator 86 configured by ultrasonic vibration units 86a and 86b respectively vibrating at the frequencies F1 and F2 which are different, and an ultrasonic vibrator driver 89 is configured to respectively supply driving electric power to each of the ultrasonic vibration units 86a and 86b. The rest parts are similar to the wire bonding apparatus 100 described before.

Figure 13:
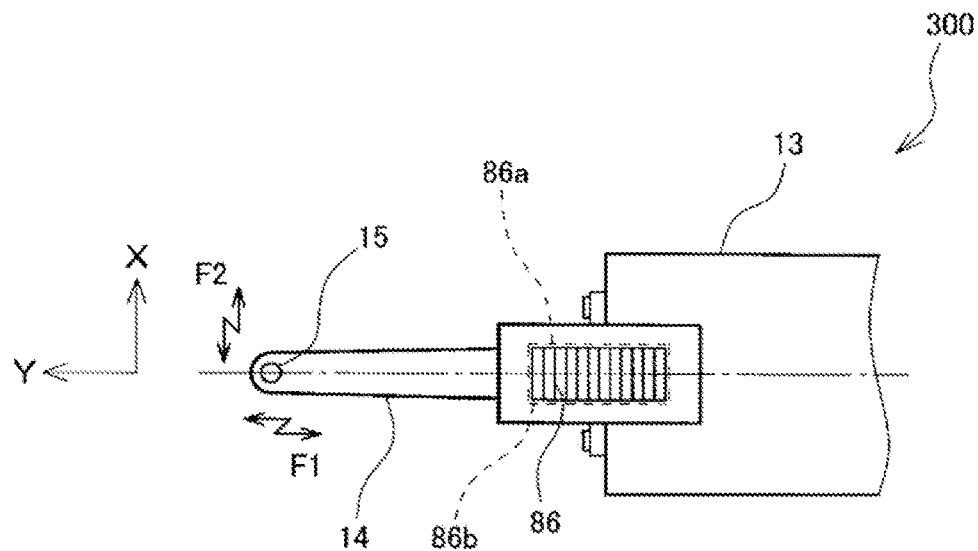
FIG. 13 is a plan view of an ultrasonic horn of a bonding apparatus of another embodiment.
Figure 14:
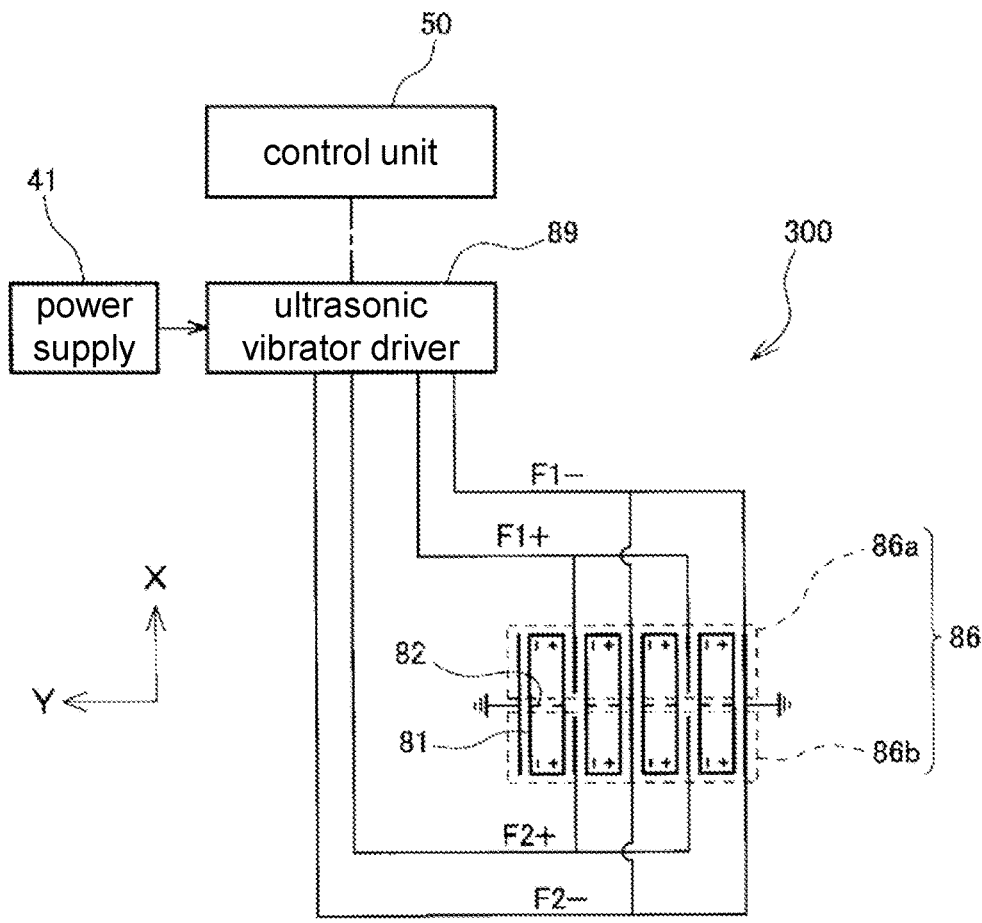
FIG. 14 is a diagram showing a configuration and a driving system of an ultrasonic vibrator of the bonding apparatus shown in FIG. 13.

As shown in FIG. 13, the ultrasonic vibrator 86 is configured by two ultrasonic vibrations units 86a and 86b on the left and right. As shown in FIG. 14, the ultrasonic vibrator 86 is configured by laminating a plurality of piezoelectric elements 81 in which left portions and right portions are insulated from each other because of a groove 82 arranged on the surface. One side and the other side of the groove 82 respectively constitute the ultrasonic vibration units 86a and 86b. Electric power with the frequency F1 is supplied to the ultrasonic vibration unit 86a from the ultrasonic vibrator driver 89, and electric power with the frequency F2 is supplied to the ultrasonic vibration unit 86b.

Similar to the wire bonding apparatus 100 described before, if the ultrasonic vibration unit 86a vibrates at the frequency F1, the ultrasonic horn 14 will resonate in a way of expanding and contracting in the Y-direction, and the front end of the capillary 15 at the front end of the ultrasonic horn 14 will vibrate in the Y-direction; and if the ultrasonic vibration unit 86b vibrates at the frequency F2, the ultrasonic horn 14 will torsionally resonate around the Y axis, and the front end of the capillary 15 will vibrate in the X-direction. Therefore, the ultrasonic vibration unit 86a constitutes the first ultrasonic vibrator, and the ultrasonic vibration unit 86b constitutes the second ultrasonic vibrator.

Because the ultrasonic vibrator 86 is configured in this way, the ratio ΔY/ΔX of the amplitude ΔY in the Y-direction and the amplitude ΔX in the X-direction of the front end of the capillary 15 can be adjusted by adjusting the amount of the electric power with the frequency F1 output to the ultrasonic vibration unit 86a from the ultrasonic vibrator driver 89 and the amount of the electric power with the frequency F2 output to the ultrasonic vibration unit 86b.

The wire bonding apparatus 300 of the embodiment has functions and effects similar to the wire bonding apparatus 100 described before. Besides, in the embodiment, it is described that the ultrasonic vibrator 86 is configured by laminating a plurality of piezoelectric elements 81 in which the left portions and the right portions are insulated from each other because of the groove 82 arranged on the surface, but the present invention is not limited to this. Two separate piezoelectric elements may be laminated, and the ultrasonic vibrator 86 may be configured by a first ultrasonic vibrator and a second ultrasonic vibrator which are independent.

As described above, each of the wire bonding apparatus 100, 200, and 300 can suppress degradation in the quality of the joining between the wire 38 and the electrode by a simple configuration.

What is claimed is:

1. A wire bonding apparatus, comprising:
   an ultrasonic vibrator capable of vibrating at two different frequencies in a Y-direction;
   an ultrasonic horn which resonates in the Y-direction by using ultrasonic vibration at a first frequency input by the ultrasonic vibrator and torsionally resonates around Y axis by using ultrasonic vibration at a second frequency, that is different from the first frequency, input by the ultrasonic vibrator to excite a bonding tool mounted to a front end with different frequencies in the Y-direction and an X-direction perpendicular to the Y-direction;
   a driver, which comprises a first circuit supplying power of the first frequency to the ultrasonic vibrator and a second circuit supplying power of the second frequency to the ultrasonic vibrator;
   a control unit which is connected to the driver and adjusts a respective magnitude of the two ultrasonic vibrations; and
   an imaging device which captures an image of an electrode, wherein
   the Y-direction is a direction in which the ultrasonic horn extends, and
   the control unit processes the image of the electrode captured by the imaging device, calculates an angle of an extending direction of the electrode with respect to the Y-direction, and
   the control unit adjusts respective output of the first circuit and the second circuit according to the calculated angle to make an extending direction of a diagonal line of a vibration range of the bonding tool to be the extending direction of the electrode.

2. The wire bonding apparatus according to claim 1, wherein
   the bonding tool connects a wire to the electrode, which is a band-shaped electrode and is disposed inclined with respect to the Y-direction.

3. The wire bonding apparatus according to claim 2, wherein
   the control unit reduces the output of the first circuit in a way that the larger the calculated angle, the smaller the ratio of the amplitude of the bonding tool in the Y-direction with respect to the amplitude of the bonding tool in the X-direction.

4. The wire bonding apparatus according to claim 2, wherein
   the control unit adjusts a ratio of the respective output of the first circuit and the second circuit so that the ratio of the amplitude of the bonding tool in the Y-direction and the X-direction becomes a ratio of the extending direction of the electrode in the Y-direction and the X-direction.

5. The wire bonding apparatus according to claim 3, wherein
   the control unit processes the image of the electrode captured by the imaging device to calculate a width of the electrode in a direction perpendicular to the extending direction of the electrode, and
   adjusts the respective output of the first circuit and the second circuit so that the amplitude of the bonding tool in the direction perpendicular to the extending direction of the electrode does not exceed the calculated width of the electrode.

6. The wire bonding apparatus according to claim 4, wherein
   the control unit processes the image of the electrode captured by the imaging device to calculate a width of the electrode in a direction perpendicular to the extending direction of the electrode, and
   adjusts the respective output of the first circuit and the second circuit so that the amplitude of the bonding tool in the direction perpendicular to the extending direction of the electrode does not exceed the calculated width of the electrode.

7. The wire bonding apparatus according to claim 1, wherein the ultrasonic horn comprises:
   a vibration amplification unit, which amplifies the ultrasonic vibration in the Y-direction input from the ultrasonic vibrator and transmits the amplified ultrasonic vibration to the front end, and
   a vibration conversion unit, which converts the ultrasonic vibration in the Y-direction to torsional vibration of the ultrasonic horn.

8. The wire bonding apparatus according to claim 7, wherein
   the vibration amplification unit has a polygonal shape in a plan view, and the vibration conversion unit is a slit which is disposed obliquely with respect to the Y-direction.

9. The wire bonding apparatus according to claim 4, wherein the ultrasonic horn comprises:
   a vibration amplification unit, which amplifies the ultrasonic vibration in the Y-direction input from the ultrasonic vibrator and transmits the amplified ultrasonic vibration to the front end, and
   a vibration conversion unit, which converts the ultrasonic vibration in the Y-direction to torsional vibration of the ultrasonic horn.

10. The wire bonding apparatus according to claim 5, wherein the ultrasonic horn comprises:
    a vibration amplification unit, which amplifies the ultrasonic vibration in the Y-direction input from the ultrasonic vibrator and transmits the amplified ultrasonic vibration to the front end, and a vibration conversion unit, which converts the ultrasonic vibration in the Y-direction to torsional vibration of the ultrasonic horn.

11. The wire bonding apparatus according to claim 6, wherein the ultrasonic horn comprises:
a vibration amplification unit, which amplifies the ultrasonic vibration in the Y-direction input from the ultrasonic vibrator and transmits the amplified ultrasonic vibration to the front end, and
a vibration conversion unit, which converts the ultrasonic vibration in the Y-direction to torsional vibration of the ultrasonic horn.

\* \* \* \* \*